Aug. 5, 1969 M. J. HELLSTROM 3,460,050

INTEGRATED CIRCUIT AMPLIFIER

Filed July 18, 1967

WITNESSES
Theodore F. Wrobel
James F. Young

INVENTOR
Melbourne J. Hellstrom
BY Dean Schron
ATTORNEY

United States Patent Office 3,460,050

Patented Aug. 5, 1969

3,460,050
INTEGRATED CIRCUIT AMPLIFIER

Melbourne J. Hellstrom, Severna Park, Md., assignor to Westinghouse Electric Corporation, Pittsburgh, Pa., a corporation of Pennsylvania Filed July 18, 1967, Ser. No. 654,258
Int. Cl. H03f 3/14, 1/34
U.S. Cl. 330—38 3 Claims

ABSTRACT OF THE DISCLOSURE

An integrated circuit structure includes an amplifier section having an input and an output connection. A dual capacitor arrangement is fabricated in the integrated circuit with one capacitor electrically connected between the input and output of the amplifier section and the other capacitor electrically connected between the input of the amplifier and an input terminal which receives the input signals to be amplified.

BACKGROUND OF THE INVENTION

Field of the invention

The invention relates to integrated circuit structures and particularly to an amplifier circuit fabricated as an integrated circuit for providing proper coupling and amplification down to low frequencies.

Description of the prior art

Various integrated circuits require the incorporation of capacitors for intended circuit operation. One type of capacitor fabrication utilizes a reversed biased P-N junction with suitable electrical connections made to the P and N semiconductor regions. In another type of capacitor structure an oxide layer is grown upon a semiconductor region and a conducting film forming one electrode is placed upon the oxide layer. A suitable connection is made to the underlying semiconductor region which then forms the other electrode of the capacitor with the oxide layer forming the dielectric of the capacitor.

In both types of capacitor fabrication the capacitance achieved in a given area is somewhat limited, a typical figure being in the order of less than one half picofarad per $mil^2$. Since one of the basic objectives in integrated circuitry is to keep the resulting structure small, it can be seen that relatively high valued capacitors take up a considerably large portion of the total integrated circuit area and in typical cases the maximum capacitance value which can be fabricated is in the order of a few hundred picofarads.

To assemble, in discrete component form, an amplifier which will provide proper coupling down to low frequencies, merely requires the proper choice of an input capacitor having a fairly large value. The properly chosen capacitor value however cannot be directly duplicated when the amplifier is fabricated as an integrated circuit due to the limitations previously discussed.

It is therefore a general object of the present invention to provide an integrated circuit amplifier which will provide proper coupling and amplification for extremely low frequency input signals.

SUMMARY OF THE INVENTION

An integrated circuit structure is provided and includes a plurality of semiconductor regions. The structure includes an amplifier circuit defined in the structure. A capacitor arrangement is additionally defined in the integrated circuit structure and includes first capacitor means electrically connected between the input of the amplifier and a point of signal amplification of the amplifier, and a second capacitor means electrically connected between the input to the amplifier and an input terminal which receives the input signals.

DESCRIPTION OF THE PREFERRED EMBODIMENT

Figure 1:
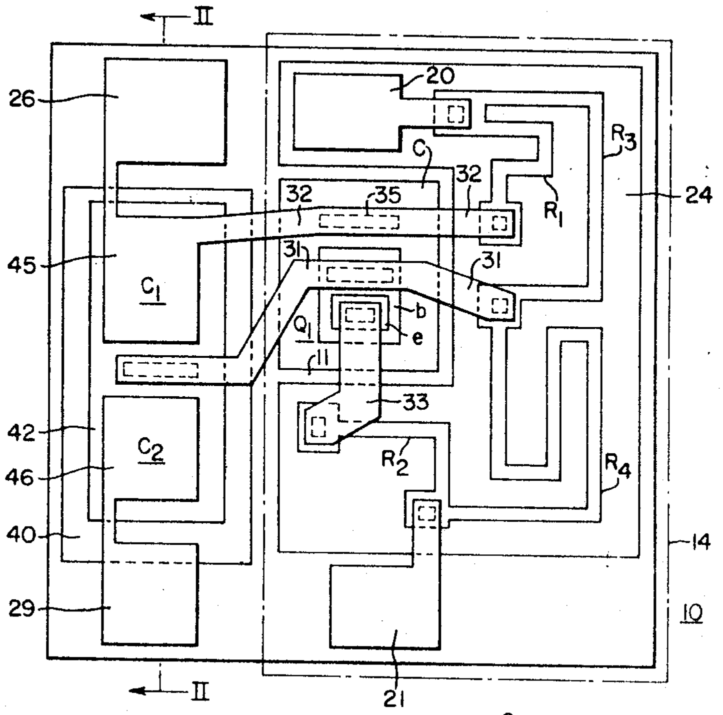
FIG. 1 illustrates a plan view of an integrated circuit in accordance with an embodiment of the present invention.

The integrated circuit structure of FIG. 1 includes a plurality of different types of semiconductor regions for performing various functions. As is common, the structure includes a P-type substrate 10 which may also join with what is commonly termed isolation walls 11, several of which are illustrated.

The integrated circuit structure includes amplifier means defined therein and for simplicity, the amplifier means is illustrated as a single transistor amplifier section 14 enclosed in dotted lines.

The single transistor $Q_1$ of the amplifier section 14 includes an N-type region *c* forming the collector, a P-type region *b* forming the base and the input connection to the amplifier, and an N-type region *e* forming the emitter of the transistor. The amplifier section 14 is illustrated with conventional symbols in FIG. 1A and the schematic components of FIG. 1A have been given the same reference character or numeral as the structural equivalent of FIG. 1.

The collector of transistor $Q_1$ is connected through a resistor $R_1$ to the B+ terminal or pad 20 to which is applied operating potential. The emitter of the transistor $Q_1$ is connected through an emitter resistor $R_2$ to a source of reference potential by means of the ground terminal or pad 21. Completing the illustrative amplifier section are two resistors $R_3$ and $R_4$ serially connected between the B+ pad 20 and the ground pad 21 with the junction between the resistors being connected to the amplifier input, that is, the base of transistor $Q_1$. In practice the resistors may be made by diffusion techniques whereby P-type semiconductor material is diffused into the junction isolated N-type semiconductor region 24 often referred to as a boat or tub.

Figure 1A:
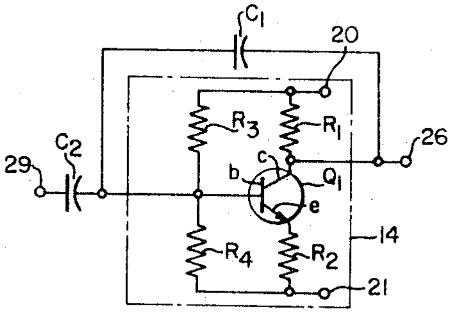
FIG. 1A illustrates the electrical schematic equivalent of the integrated circuit of FIG. 1.

For the example illustrated, the amplifier section 14 provides an output signal at the collector of the transistor $Q_1$, and accordingly an output terminal or pad 26 is provided which in the structure of FIG. 1, as in the circuit of FIG. 1A, is outside of the dotted box 14.

A first capacitor means is electrically connected between the input of the amplifier section and a point in the amplifier section at which signal amplification takes place. In the embodiment illustrated, the first capacitor means takes the form of a capacitor $C_1$ electrically connected between the base *b* of transistor $Q_1$ and the collector *c* of transistor $Q_1$ since the collector *c* is a point of a signal amplification. The capacitor $C_1$ is defined in the integrated circuit structure of FIG. 1 and has been given the general character reference $C_1$ and its typical structure will be described in more detail with respect to FIG. 2. Completing the integrated circuit structure is a second capacitor means in the form of capacitor $C_2$ electrically connected between the input terminal or pad 29 and the input to the amplifier section 14.

In a typical integrated circuit structure, the semiconductor regions may be covered by an electrically nonconducting material such as a silicon oxide layer upon which is provided an electrically conducting material such as aluminum, for making electrical connections between the various regions providing electrical functions. Accordingly, the B+ and ground pads 20 and 21 and the outpad and in-pad 26 and 29 may be aluminum deposited over an oxide layer. Aluminum strip 31 forms an input connection which contacts the base region *b* and the junction between resistors $R_3$ and $R_4$. The aluminum strip 32 interconnects the collector region *c* with the outpad 26 and one end of resistance $R_1$ while the aluminum strip 33 provides the electrical connection from the emitter region *e* of transistor $Q_1$ to one end of resistance $R_2$. Underlying the aluminum strips in the various regions are rectangles (such as rectangle 35 in the collector region). These rectangles represent a contact hole through the oxide layer, by which the aluminum makes electrical contact with the underlying semiconductor region.

Figure 2:
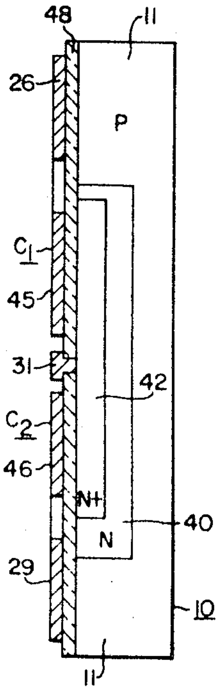
FIG. 2 illustrates a view along the lines II—II of FIG. 1.

The capacitors defined in the integrated circuit structure will now be described in more detail with reference to both FIGS. 1 and 2. The capacitor section includes an N-type semiconductor region 40 forming a tub, or isolated semiconductor region, and a more highly doped region 42 of the same type of conductivity. The N+ region 42 is formed during the same process step which forms the emitter *e* of the NPN transistor. It is used in the capacitor because of its high electrical conductivity. The N+ region 42 forms the electrodes of both capacitors $C_1$ and $C_2$ while the respective other electrodes are formed by the aluminum contact 45 for capacitor $C_1$ and aluminum contact 46 for capacitor $C_2$. Electrical connection of the aluminum strip 31 is made to the N+ region 42 through the oxide layer 48 (FIG. 2).

Figure 3:
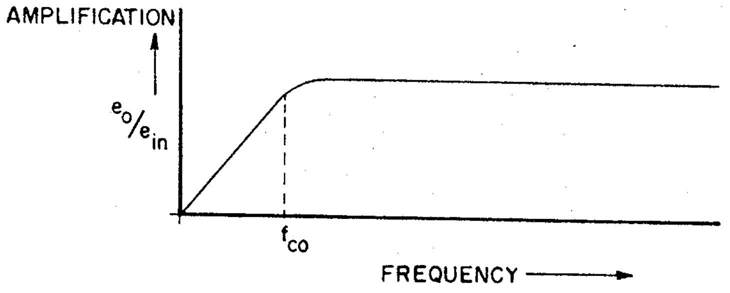
FIG. 3 is an amplification versus frequency plot of a circuit according to the teachings herein.

In low frequency amplifiers, for example, an audio frequency amplifier where the frequency range is approximately 16 to 20,000 cycles per second, the cutoff frequency below which proper amplification does not take place is a function of the input resistance to the amplifier and the input capacitance. Basically, the higher the capacitance and the higher the input resistance, the lower will be the cutoff frequency. As was stated, when assembled with discrete components, proper coupling down to the low frequencies may be achieved by using higher valued capacitors available in component form, however these equivalent higher valued capacitors cannot be fabricated in integrated circuit form. Proper coupling could be achieved if the input resistance to the integrated circuit amplifier were of infinite value. In practice the input resistance will be finite and may typically be in the approximate range of 10 kilohms to one megohm. With reference now to FIG. 1A and FIG. 3, the advantages of the integrated circuit of FIG. 1, will be demonstrated. FIG. 3 is a response curve of the amplifier of FIG. 1A and wherein the ordinate represents amplification, that is the ratio of the output signal $e_o$ at output pad 26 to the input voltage $e_{in}$ at input pad 29. The abscissa represents the logarithm of frequency. It is seen in the curve of FIG. 3 that amplification is relatively constant at the higher frequencies and drops off approximately linearly below a cutoff frequency point designated $f_{co}$. For a typical circuit such as in FIG. 1A it may be shown that $$f_{co}=\frac{1}{2R\pi[C_1+(1+A)C_2]} \qquad (1)$$

where $f_{co}$=cutoff frequency
R=input resistance
$C_1$ and $C_2$=the value of capacitors $C_1$ and $C_2$ respectively
A=the gain of the amplifier section 14.

By way of example and with an input resistance of 500 kilohms and capacitor values of 40 picofarads for $C_1$ and $C_2$, a reasonable value for fabrication in an integrated circuit, and a gain of 18, the cutoff frequency is calculated to be $$f_{co}=398 \text{ Hertz}$$

By way of comparison and with the same size integrated circuit structure if the capacitance of capacitor $C_1$ were incorporated into the major $C_2$ the cutoff frequency would be $$f_{co}=\frac{1}{2\pi R(C_1+C_2)} \qquad (2)$$

Utilizing the previously stated values for $C_1$, $C_2$, R and A, the cutoff of frequency for Equation 2 is $$f_{co}=3980 \text{ Hertz}$$

For the arbitrary values chosen therefore the integrated circuit of the present invention utilizing the dual capacitor arrangement provides a 10-fold improvement with respect to the cutoff frequency over a single higher valued capacitor arrangement.

For the described circuit the gain from the input pad 29 to the output pad 26 would be somewhat less than unity. However, gain is relatively easy to achieve with integrated circuit structures and may be provided by a subsequent amplifier stage (not shown).

Although the present invention has been described with a certain degree of particularity, it should be understood that the present disclosure has been made by way of example and that modifications and variations of the present invention are made possible in the light of the above teachings.

I claim as my invention:

1. A low frequency amplifier circuit comprising:

(A) an integrated circuit structure including a plurality of semiconductor regions;

(B) amplifier means defined in said integrated circuit structure, and including an input and an output connection and having an equivalent input resistance R, and a gain A;

(C) first capacitor means defined in said integrated circuit structure and electrically connected between said input connection and a circuit point of signal amplification of said amplifier means and having a value $C_1$;

(D) an input terminal for said integrated circuit structure, for the application of input signals in the range of approximately 16 to 20,000 cycles per second;

(E) second capacitor means defined in said integrated circuit structure and electrically connected between said input terminal and said input connection of said amplifier means and having a value $C_2$; and (F) said values $C_1$ and $C_2$ being chosen that the amplifier circuit cutoff frequency $$f_{co}=\frac{1}{2R[C_1+(1+A)C_2]}$$

is in the low frequency portion of said range of approximately 16 to 20,000 cycles per second.

2. A circuit according to claim 1 wherein:

(A) the first capacitor means is a single capacitor.

3. A circuit according to claim 2 wherein:

(A) the single capacitor is electrically connected between the input and output connection of the amplifier means.

References Cited

UNITED STATES PATENTS

| | | | |
|---|---|---|---|
| 3,244,995 | 4/1966 | Barditch et al. | 330—38 X |
| 3,254,308 | 5/1966 | McLean et al. | 330—28 |

ROY LAKE, Primary Examiner

JAMES B. MULLINS, Assistant Examiner

U.S. Cl. X.R.

330—28